(12) United States Patent
Koeppendoerfer et al.

(10) Patent No.: US 11,002,781 B2
(45) Date of Patent: May 11, 2021

(54) METHOD FOR MONITORING A LINE, AND MEASURING ARRANGEMENT CONTAINING LINE

(71) Applicant: LEONI KABEL GMBH, Nuremberg (DE)

(72) Inventors: Erwin Koeppendoerfer, Schwabach (DE); Markus Schill, Munich (DE)

(73) Assignee: LEONI Kabel GmbH, Nuremberg (DE)

( * ) Notice: Subject to any disclaimer, the term of this patent is extended or adjusted under 35 U.S.C. 154(b) by 272 days.

(21) Appl. No.: 16/210,219

(22) Filed: Dec. 5, 2018

(65) Prior Publication Data
US 2019/0107574 A1 Apr. 11, 2019

Related U.S. Application Data

(63) Continuation of application No. PCT/EP2017/064129, filed on Jun. 9, 2017.

(30) Foreign Application Priority Data

Jun. 15, 2016 (DE) .......................... 10 2016 210 601.5

(51) Int. Cl.
*G01R 31/11* (2006.01)
*G01K 7/34* (2006.01)
(Continued)

(52) U.S. Cl.
CPC .............. *G01R 31/11* (2013.01); *G01K 7/343* (2013.01); *G01R 31/58* (2020.01);
(Continued)

(58) Field of Classification Search
CPC .............. G01R 31/11; G01R 31/50–55; G01R 31/58–60; G01K 7/343
See application file for complete search history.

(56) References Cited

U.S. PATENT DOCUMENTS 3,753,086 A * 8/1973 Shoemaker, Jr. ...... G01R 31/58
324/533
5,903,156 A * 5/1999 Matsumaru ............ G01R 31/11
324/503

(Continued)

FOREIGN PATENT DOCUMENTS

CN 204495933 U * 7/2015
CN 105021951 A 11/2015
(Continued)

*Primary Examiner* — Patrick Assouad
*Assistant Examiner* — Demetrius R Pretlow
(74) *Attorney, Agent, or Firm* — Laurence A. Greenberg; Werner H. Stemer; Ralph E. Locher

(57) ABSTRACT

A method for monitoring a line is done in a simple manner by feeding test pulses and determining any interference on the test pulses by reflected portions of the same test pulses. In a normal state of the line, the measuring pulses have a transit time which is known in advance due to the predetermined length of the line, and the respective reflected portions of the measuring pulses are generated which propagate in an opposite direction to the measuring pulses. A deviation of the transit time from a previously known transit time, and a deviation from the normal state are recognized in dependence on the overlay.

12 Claims, 2 Drawing Sheets

(51) Int. Cl.
    *G01R 31/58*         (2020.01)
    *G01R 31/00*         (2006.01)
    *G01K 7/16*          (2006.01)
    *G01R 31/50*         (2020.01)

(52) U.S. Cl.
    CPC ...... *G01K 2007/166* (2013.01); *G01R 31/007* (2013.01); *G01R 31/50* (2020.01)

(56) References Cited

U.S. PATENT DOCUMENTS

| | | | | |
|---|---|---|---|---|
| 6,011,399 | A * | 1/2000 | Matsumaru | G01R 31/11 324/538 |
| 6,442,498 | B1 * | 8/2002 | Krigel | G01R 31/58 702/108 |
| 6,825,672 | B1 * | 11/2004 | Lo | H04M 3/28 324/533 |
| 6,992,491 | B1 * | 1/2006 | Lo | G01R 31/58 324/533 |
| 7,026,825 | B1 * | 4/2006 | Lo | G01R 31/58 324/543 |
| 7,679,371 | B1 * | 3/2010 | Lo | G01R 31/11 324/533 |
| 7,808,247 | B1 * | 10/2010 | Lo | G01R 31/58 324/533 |
| 9,880,212 | B2 | 1/2018 | Weindl et al. | |
| 2002/0125891 | A1 * | 9/2002 | Allan | G01R 31/11 324/534 |
| 2002/0169585 | A1 * | 11/2002 | Jones | H04B 3/493 702/189 |
| 2004/0046570 | A1 * | 3/2004 | Teich | G01R 31/50 324/541 |
| 2004/0100272 | A1 * | 5/2004 | Styles | G01R 31/086 324/523 |
| 2004/0183544 | A1 * | 9/2004 | Allan | G01R 31/58 324/533 |
| 2005/0212526 | A1 * | 9/2005 | Blades | G01R 31/67 324/543 |
| 2006/0061368 | A1 * | 3/2006 | Furse | G01R 31/11 324/519 |
| 2014/0091809 | A1 * | 4/2014 | Sargand | G01R 31/11 324/539 |
| 2014/0291039 | A1 * | 10/2014 | Hanson | G01G 7/06 177/1 |
| 2014/0320139 | A1 * | 10/2014 | Renforth | G01R 31/50 324/415 |
| 2015/0077131 | A1 * | 3/2015 | Incarbone | G01R 31/083 324/533 |
| 2016/0290876 | A1 | 10/2016 | Koeppendoerfer et al. | |
| 2017/0153283 | A1 * | 6/2017 | Gontier | G01R 31/58 |
| 2017/0199235 | A1 * | 7/2017 | Jeon | G01R 31/58 |
| 2019/0079131 | A1 * | 3/2019 | Pinhasi | G01R 31/088 |

FOREIGN PATENT DOCUMENTS

| | | |
|---|---|---|
| DE | 102010022413 A1 | 12/2011 |
| DE | 102013227051 A1 | 6/2015 |
| EP | 2930522 A1 | 10/2015 |
| JP | H10122900 A | 5/1998 |
| JP | 2008039532 A | 2/2008 |
| JP | 2013024614 A | 2/2013 |
| WO | 2015091552 A1 | 6/2015 |

* cited by examiner

METHOD FOR MONITORING A LINE, AND MEASURING ARRANGEMENT CONTAINING LINE

CROSS-REFERENCE TO RELATED APPLICATION

This is a continuation application, under 35 U.S.C. § 120, of copending international application No. PCT/EP2017/064129, filed Jun. 9, 2017, which designated the United States; this application also claims the priority, under 35 U.S.C. § 119, of German patent application No. DE 10 2016 210 601.5, filed Jun. 15, 2016; the prior applications are herewith incorporated by reference in their entirety.

BACKGROUND OF THE INVENTION

Field of the Invention

The invention relates to a method for monitoring a line, a measuring arrangement containing a line, and the use of a line containing a measuring conductor.

A line is for example used for the transmission of energy and/or signals, and for this purpose contains at least one core, usually a plurality of cores, i.e. insulated conductors. Pluralities of cores are often grouped together by a common line sheath to form a line. In many applications, in the automotive field for example, lines are subject to a variety of stresses, the duration and intensity of which are often unknown. The potentially varied and highly changeable environmental conditions, such as thermal influences, can also often only be estimated inadequately, if at all, in order to be able to predict the wear of a line. In order to be able to guarantee a specific minimum service life, a line therefore typically is of an over-dimensioned design. It is alternatively possible to design a line more efficiently in terms of its dimensioning and material selection, in that a monitoring, i.e. checking, of the line is carried out in the course of operation, or at least at regular intervals.

SUMMARY OF THE INVENTION

Against this background, it is an object of the invention to provide a method and a measuring arrangement by which a regular, preferably sustained, monitoring of a line is realized in a particularly simple and economical manner. The monitoring should be performed here in particular in the installed state of the line in an end product and/or in the intended operation of the line.

The object is achieved according to the invention by a method with the features as claimed in the first independent claim, by a measuring arrangement with the features as claimed in the second independent claim, and by a use of a line with a measuring conductor as claimed in the third independent claim. Advantageous embodiments, developments and variants are the objects of the dependent claims. The explanations given here in association with the method also apply analogously to the measuring arrangement and the use, and vice versa.

The method is used for monitoring a line with a predetermined length, i.e. the line has already been cut to a known length, and is not present as continuous product. The line contains a measuring conductor which extends in particular along the line, preferably along the entire line. The measuring conductor is preferably configured as a simple wire or stranded conductor, and consists, for example, of copper.

Multiple measuring pulses are fed into the measuring conductor in the method. The multiple measuring pulses are fed in sequence with a temporal separation. In particular, a first measuring pulse is transmitted, i.e. fed into the measuring conductor, and at a time following the first measuring pulse, a second measuring pulse is transmitted, i.e. fed into the measuring conductor. The temporal separation between two measuring pulses in sequence is determined by a clock rate with which the measuring pulses are repeatedly generated. In a normal state of the line, the measuring pulses have a transit time which is known in advance due to the predetermined length of the line. The transit time is given by the length, in particular in combination with the materials of which the line is made. The transit time is here determined by the propagation or spreading speed of a measuring pulse along the measuring conductor. Usual propagation speeds lie in the range between 1 and $2.5 \cdot 10^8$ m/s, and depend in particular on the material that is used for insulating the core or cores.

Furthermore, respective reflected portions of the measuring pulses, which propagate in the opposite direction to the measuring pulses, are generated in the method. This takes place in particular through corresponding configuration of the measuring conductor. Fundamentally, a change in impedance is necessary to generate a reflection. The reflected portions are, for example, generated at an open or short-circuited end of the measuring conductor. Thus in particular a reflected portion of the first measuring pulse is generated in the method. This reflected portion propagates in the opposite direction through the measuring conductor, i.e. against the original direction of the first measuring pulse.

The line is then monitored in that a determination is made, in particular continuously or repeatedly, as to whether at a predetermined measuring point an overlay, particularly in time, of the reflected portions is present on the measuring pulses, i.e. in particular an overlay of the reflected portion of the first measuring pulse with the second measuring pulse, and in that, depending on the overlay, a deviation of the transit time from the previously known transit time, and a deviation from the normal state, is recognized. In other words, on the basis of the overlay of the measuring pulses with the reflected portions, a change in the electrical length of the measuring conductor is determined, wherein the electrical length corresponds to the single transit time of an electrical signal through the measuring conductor. Such a change is an indicator that the state of the line as a whole has also changed. Such a change of the state is, for example, a heating of the line above a predetermined operating temperature, or a break or other wear of the line. It is accordingly established through a determination of the overlay whether the line is in the normal state, or whether the line is exposed to special environmental influences or is damaged.

It is, in principle, conceivable that a line is monitored, e.g. by so-called time domain reflectometry, abbreviated to TDR. A measuring pulse is here fed into a conductor that extends along the line, and its transit time through the conductor is measured. Conclusions as to the state of the line can then be drawn on the basis of the transit time. Thus some insulation materials exhibit, for example, a temperature-dependent dielectric constant, so that a change in the temperature of the line causes measurable change in the transit time. The measurement and evaluation by time domain reflectometry requires, however, a great deal of equipment and is also very expensive. Conventional systems for time domain reflectometry are thus not suitable for mass applications and high piece counts, i.e. they are particularly unsuitable for the automotive field. Such systems usually rather find applications in laboratory work or in individual applications. To save weight and installation space it is however desirable to implement a regular, or even continuous, monitoring of a line in the most space-saving and economical manner possible, even in end products having, in particular, high piece counts.

The invention is now based on the object of simplifying the monitoring of the line in that a complex time domain reflectometry with transit time measurement is omitted, and instead an overlay of measuring pulses that are fed in and reflected is simply examined. The reflected portion of a first measuring pulse has passed along the measuring conductor twice, namely once on the way out as a measuring pulse and a second time on the way back as a reflected portion. A second measuring pulse is transmitted at a time following the first measuring pulse. The reflected portion on the return path is then necessarily overlaid by the second measuring pulse at a specific point. The concrete position of this specific point along the line is, however, dependent on the propagation speed of the measuring pulses, and thus on the environmental conditions and/or the state of the line. In other words, the specific point drifts or moves along the line, depending on the state of the line, i.e. the position of the specific points is changeable, and changes depending on the state of the line. The specific point is also referred to as the overlay point. As a result of the changeable position, the specific point is also called a moving point.

The second measuring pulse and the reflected portion of the first measuring pulse each have a voltage, namely a transmitted voltage or a reflected voltage. These are added together at the point of the overlay, so that a total voltage that differs from the voltage of a single measuring pulse, i.e. the transmitted voltage, namely by the reflected voltage, results. The reflected voltage is usually smaller than the original transmitted voltage as a result of attenuation effects and of an incomplete reflection, but is typically at least a few millivolts, and is therefore still effectively measurable. A corresponding voltage difference is particularly easy to determine, particularly in comparison with a transit time measurement. The length of a line in an on-board network of a vehicle is usually thus only a few meters, up to a maximum of 10 or 20 m. The transit time along such a line then lies in the range of nanoseconds or even of picoseconds, and can only be measured with difficulty.

The point of overlay described above moves along the line, depending on the state of said line. It follows that there is an overlay at the measuring point when said point coincides with the measuring point. The voltage at the measuring point is increased above the transmitted voltage, and an overlay is recognized, otherwise only the lower voltage of the measuring pulse is measured, and the absence of an overlay is recognized.

In a suitable configuration, the measuring pulses and the reflected portions are overlaid at the measuring point in the normal state of the line, so that a deviation from the normal state is advantageously recognized if no overlay is present. In the normal state, the measuring conductor is thus synchronized in terms of the fed measuring pulses and the reflected portions. In this configuration, the monitoring of the cable is reduced to a particularly simple, qualitative measurement, in which in particular only a check is made as to whether an overlay is present or not, i.e. whether the measuring pulses and the reflected portions are synchronous at the measuring point or not. If there is no overlay, i.e. no synchronization, it is thus recognized that the transit time of the measuring pulses differs from the previously known transit time, and it is accordingly concluded that the state has changed away from the normal state.

An inverse monitoring is, in principle, also suitable, in which in the normal state no overlay is present, and then a deviation is recognized when an overlay is present. A specific threshold value for the deviation can thus be marked by the overlay, the reaching of which is recognized merely by means of a qualitative measurement. A quantitative measurement is advantageously not necessary.

Thus, altogether, a coincidence or a separation of the measuring point and of the overlay point is monitored, in order to conclude in the presence of a corresponding change a change in the state of the line.

Advantageously the overlay is measured in that a check is made as to whether an excess voltage of the measuring pulses with respect to the transmitted voltage, which is an output voltage, is present at the measuring point. The overlay can in this way thus be determined as a voltage change above the transmitted voltage with simple and economical electronics. In a suitable design, the overlay is measured by a simple comparator which compares the voltage currently present at the measuring point with the transmitted voltage of a measuring pulse, and in this way recognizes an overlay as an excess voltage at the measuring point.

The measuring pulses each have a temporal width, which is also referred to as the pulse time. There is a pause, with a pause time, between two pulses. In order to achieve an overlay which is as defined as possible, and to be able to determine this as unambiguously as possible, the measuring pulses are expediently significantly shorter than the pauses, i.e. the pulse time is significantly shorter than the pause time. "Significantly shorter" here means in particular that the pulse time is at least an order of magnitude smaller than the pause time. Typical pulse times are between 1 and 100 ns, typical pause times between 0.1 and 100 µs.

The method is particularly suitable for realization by means of digital circuit technology. This results in particular from the simplicity of the measurement. Today's microprocessors for digital circuits are regularly designed for operation at clock rates in the GHz range, and are therefore suitable, including in the present case, for generating the measuring pulses against the background of the required pulse times. In a particularly preferred embodiment, the measuring pulses are therefore formed by a digital measuring signal, i.e. realized as a bit sequence with a plurality of sequential bits. The measuring pulses are then realized as a number of on-states, or 1-bits, e.g. at a voltage of 5 V, the pause times as a sequence of off-states or 0-bits, e.g. at a voltage of 0 V. The measuring signal is then a sequence of rectangular pulses, namely the measuring pulses all of which are separated by pauses. Since the bits of the bit sequence usually have a fixed temporal width, and since the measuring pulses are expediently significantly shorter than the pauses, as described above, a measuring pulse is preferably formed by merely one or a few 1-bits, and a pause is realized by a plurality of 0-bits in comparison with the number of the 1-bits of a measuring pulse. The abovementioned pulse and pause times in particular are realized through bits of a fixed width in this way.

Preferably, the measuring pulses are repeatedly generated with a settable clock rate, wherein the clock rate is adjusted until the measuring pulses and the reflected portions are overlaid at an adjusted clock rate. The setting of the clock rate is not done here during the manufacture or assembly of the line, but rather in the installed state, in particular during operation. A quantitative measurement of the deviation from the normal state is advantageously realized by setting the clock rate. Through adjusting the clock rate, which in effect means through a change to the pause times, a transit time difference between the actual transit time and the previously known transit time is compensated for. The adjusted clock rate is then expediently compared to the clock rate in the normal state. The size of the difference represents a measure for the degree of the deviation, and thus for the degree of the stress on or damage to the cable. The clock rate can particularly easily be set with a digital system, in that the pause times are lengthened or shortened simply by adding or removing 0-bits.

A quantitative measurement of an operating parameter of the line can, furthermore, be realized through setting the clock rate. The temperature of the line is, for example, such an operating parameter. In one suitable embodiment, an operating parameter, in particular a temperature, of the line is therefore determined on the basis of the adjusted clock rate. The connection of the clock rate to the operating parameter is realized, for example, through a table stored in a memory. The operating parameter is alternatively calculated on the basis of the clock rate by means of a previously known functional relationship.

In addition or as an alternative to a temperature measurement, the line is checked for a mechanical stress in a suitable variant. The operating parameter here is the mechanical stress on the line, its mechanical integrity or its functionality in general. This is based on the consideration that a mechanical stress, in particular a fracture location, in the measuring conductor leads to a shortened transit time with corresponding consequences for the overlay. Mechanical damage to the line can accordingly also be recognized through the measuring principle described at the beginning. This is particularly helpful for lines that are subjected to frequent alternating bending stress, for example in the automotive field, and also in particular in the case of robots.

In an expedient embodiment, a material with a dielectric coefficient that depends on an operating parameter, in particular the temperature, of the line is arranged along the measuring conductor. This ensures in a particularly simple manner that changing environmental conditions have a measurable influence on the line. The measuring conductor is here at least partially surrounded by the material or lies against it, so that the propagation speed of measuring pulses that propagate through the measuring conductor are influenced by the material. Preferably, the material forms an insulation of a core of the line, and the measuring conductor is applied to the insulation or embedded in it. The material alternatively forms a line sheath with which the measuring conductor is in contact or in which the measuring conductor is embedded.

In a preferred embodiment, the measuring conductor is connected to a measuring terminal of a measuring unit, wherein the measuring pulses are generated and the overlap measured by the measuring unit. A measurement that is separated from the feed is, in principle, also suitable. The combination and common execution by a single measuring unit is, however, particularly efficient. The measuring terminal then acts as the feed point and as the measuring point at the same time. The measuring terminal is expediently a serial terminal of a digital circuit. A digital measuring signal is then on the one hand fed into the measuring conductor via the serial terminal, and on the other hand an overvoltage is measured there.

The measuring arrangement contains a line which has a predetermined length and which comprises a measuring conductor. The measuring arrangement, furthermore, contains a measuring unit, wherein the measuring unit is configured to monitor the line in such a way that a plurality of measuring pulses is fed into the measuring conductor. The measuring pulses have a transit time in a normal state of the line which is known in advance through the predetermined length of the line, respectively reflected portions of the measuring pulses are generated which propagate in the opposite direction to the measuring pulses, and the line is monitored in that whether an overlay of the measuring pulses with the reflected portions is present at a predetermined measuring point is determined, and in that, depending on the overlay, a deviation of the transit time from the previously known transit time, and a deviation from the normal state, are recognized. The measuring arrangement is designed in particular to carry out the method described above. The advantages emerge accordingly.

In an expedient development, the measuring pulses are generated with a clock rate, and the clock rate is set depending on the previously known transit time in the normal state, and depending on the predetermined length of the line. In this way it is ensured that an overlay of the measuring pulses and the reflected portions is present in the normal state, and that a deviation from the normal state can be recognized in a simple manner through a disappearance of the overlay. The clock rate is accordingly set here by the manufacturer, i.e. during the assembly or production of the line, being set to a normal clock rate. The measuring unit is for example configured for this purpose in such a way that it generates appropriately long pauses between the measuring pulses. The measuring arrangement which has been prepared in this way is then simply installed into the end product, e.g. into a vehicle.

The line usually contains at least one core, alternatively a plurality of cores, conductors and/or other functional elements such as optical fibers or a strain relief. From the mechanical point of view, the line also contains a neutral fiber which does not undergo a change of length under bending stress. This neutral fiber is not necessarily a concrete component of the line, but rather, in general, the line in the longitudinal direction that does not experience any change in length when bending. The measuring conductor is preferably arranged further toward the outside than the core in the radial direction with respect to the neutral fiber, i.e. perpendicular to the longitudinal direction. This ensures that the measuring conductor is subjected to a more marked mechanical stress than the core, in particular when the line is bent, and therefore that it also becomes worn and fractures earlier. A potential failure of the core is then recognized at an early stage through the previous damage to the measuring conductor. A fracture of the measuring conductor is expediently first recognized, whereupon a warning signal is issued, so that the line can be removed before the core also fails. In this way it is also possible to dimension the cores significantly smaller, since a reliable monitoring is realized with the measuring conductor, which makes it unnecessary for the core to have an oversized design for extreme cases. Costs and installation space are advantageously saved as a consequence of this.

The method and the measuring arrangement are particularly suitable for use in an on-board network of a vehicle. In such an on-board network, the lengths of the lines are known in advance, so that the transit times in the normal state are also known, and the measuring pulses, or more precisely their clock rates, can be set in advance. In this way it is possible to apply the above-described method for monitoring.

At least two variants are suitable here. In a first variant, a line with a corresponding measuring conductor is installed into the on-board network, and a suitable measuring unit, to which the measuring conductor is connected, is already integrated into the on-board network or into the vehicle, e.g. as a component of a control apparatus. In a second variant, the measuring unit is integrated as an independent unit into the line, so that it is an intelligent line that monitors itself autonomously. The measuring unit is here usefully connected to a higher-level control unit of the on-board network or of the vehicle. An independent, in particular autonomous, design of the line is, however, also suitable. The line here also for example contains a fuse that is operated by the measuring unit, and, for example, disconnects a core of the line from the on-board network if a deviation from the normal state is recognized.

Other features which are considered as characteristic for the invention are set forth in the appended claims.

Although the invention is illustrated and described herein as embodied in a method for monitoring a line, and a measuring arrangement containing a line, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
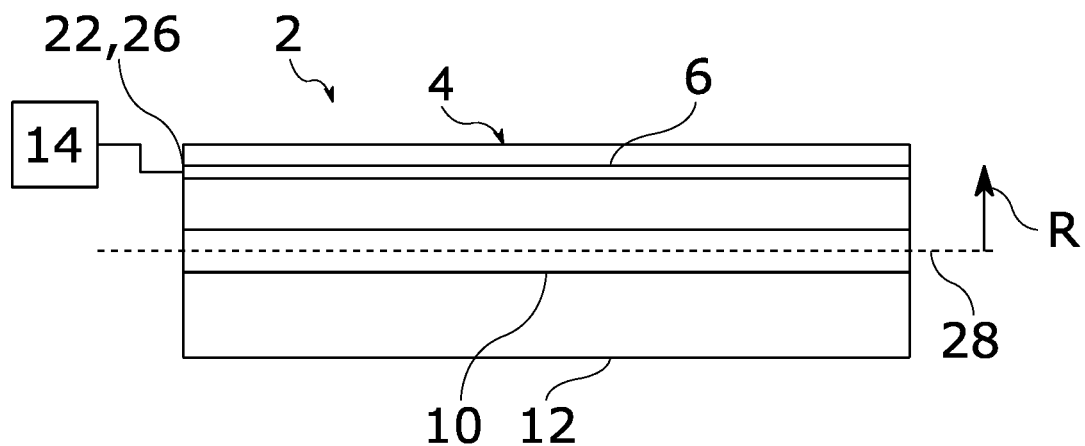
FIG. 1 is a diagrammatic, sectional view of a measuring arrangement according to the invention.

Referring now to the figures of the drawings in detail and first, particularly to FIG. 1 thereof, there is shown a measuring arrangement 2. This contains a line 4 which in turn contains a measuring conductor 6, which extends in a longitudinal direction along the line 4. In the exemplary embodiment illustrated, the line 4 is a simple, single-core line 4, i.e. one core with a central conductor 10 that is surrounded by insulation 12. The measuring conductor 6 is embedded in this insulation 12. In a variant, not illustrated, the line 4 contains a plurality of cores, which may differ from one another under some circumstances, and/or other line or functional elements.

Figure 2:
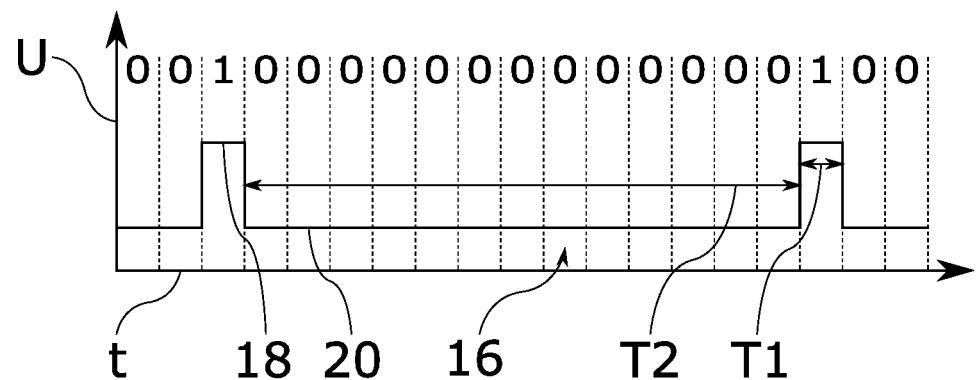
FIG. 2 is an illustration showing a measuring signal.

The measuring conductor 6 is connected to a measuring unit 14, so that the line 4 can be monitored in respect of a deviation from a normal state. Examples for such a deviation include an excessive heating of the line 4 above a predetermined operating temperature, and a fracture as a result of an excessive bending of the line 4. The monitoring of the line 4 is explained in more detail below with respect to FIGS. 2 to 4.

The measuring unit 14 generates a measuring signal 16 which consists of periodically recurring measuring pulses 18 with pauses 20 inserted between them. A section of such a measuring signal 16 is plotted in FIG. 2 as a voltage U against time t. The measuring signal 16 illustrated is here a digital measuring signal 16, in which the measuring pulses 18 and the pauses 20 are realized as a bit sequence. A respective measuring pulse 18 here corresponds to a single 1-bit, while a pause 20 is composed of a plurality of 0-bits. The individual bits are suggested by vertical dashed lines. The measuring pulses 18 are significantly shorter than the pauses 20, in particular at least an order of magnitude shorter. Altogether a recurring rectangular signal arises.

A respective measuring pulse 18 contains a pulse time T1 which typically lies in the range between 1 and 10 ns. A respective pause 20 lasts for a pause time T2, which is typically between 0.1 and 100 µs. From this, a clock rate, i.e. a repetition rate of the measuring pulses 18, in the range between several tens of kilohertz up to several hundreds of megahertz, or even a few gigahertz, arises. Such a bit sequence can be realized particularly easily by a digital circuit, so that the measuring unit 14, which then contains such a circuit, is particularly simple and compact.

Figure 3:
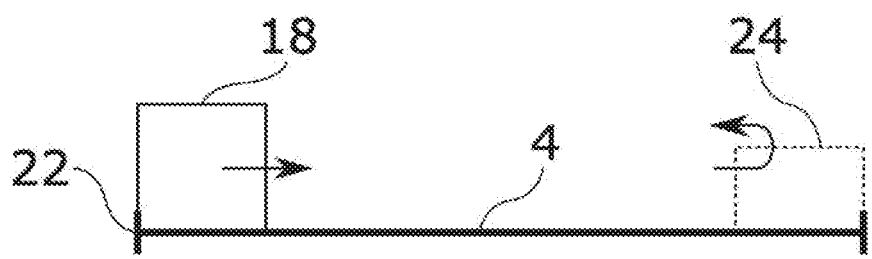
FIG. 3 is an illustration showing a measuring pulse and a reflected portion of the same.
Figure 4:
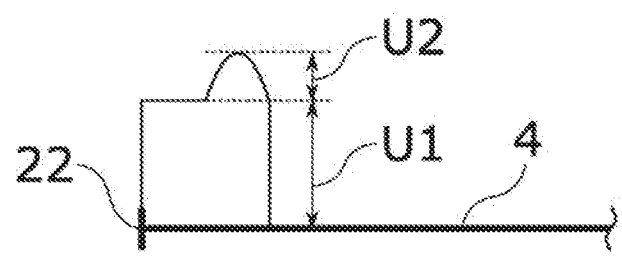
FIG. 4 is an illustration showing an overlay of the measuring pulse and the reflected portion.

The measuring pulses 18 are fed into the measuring conductor 6 to monitor the line 4, this being done at a measuring terminal 22 at which the measuring unit 14 is connected to the measuring conductor 6, and which is thus a feed point at the same time. At the measuring terminal 22, a respective measuring pulse 18 has a voltage U, which is referred to as the transmitted voltage U1. The measuring pulse 18 propagates along the measuring conductor 6, and is usually weakened as it does so, i.e. attenuated. A portion of the measuring pulse 18 is reflected as a reflected portion 24 at the end, and propagated in the opposite direction, i.e. back in the direction of the measuring terminal 22. This is illustrated in FIG. 3 which illustrates the line 4 schematically, along with a measuring pulse 18 at the left-hand end, i.e. at the measuring terminal 22, and the reflected portion 24 of the measuring pulse 18 at the right-hand end.

In order to make sure that the measuring conductor 6 fractures before the conductor 10 of the core, the measuring conductor 6 is arranged further outward in the radial direction R than the core with respect to a neutral fiber 28 of the line 4. As a result, the measuring conductor 6 is subjected to a heavier mechanical stress, and wears correspondingly faster.

The presence of this overvoltage is now checked, in order to monitor the line 4. The voltage in the measuring conductor 6 is measured at a predetermined, i.e. specified, measuring point 26, for this purpose. As in the exemplary embodiment, the measuring point 26 is preferably the same as the measuring terminal 22. A different position along the measuring conductor 6 is, however, also conceivable. A determination is made at the measuring point 26 as to whether an overlay is present, in that, for example, a check is made for an overvoltage. An elaborate measurement of transit time is omitted.

The clock rate is set in the present case such that an overlay is present at the measuring point 26 in the normal state. If the environmental conditions are changed, or if the line 4 is damaged, the state of the line 4 thus changes. The line 4 is, for example, heated, and the insulation 10 has a temperature-dependent dielectric coefficient, so that the heating leads to a changed transit time of the measuring pulses 18 in the measuring conductor 6. As a result, however, the previously set overlay is also lost, which means that the initially set synchronization between the measuring pulses 18 fed in and reflected portions 24 at the measuring point 26 becomes lost. An overvoltage is no longer created.

This is recognized by the measuring unit 14, from which it is concluded that there is a deviation from the normal state.

Alternatively or in addition to the heating, a mechanical wear of the line 4 can also be recognized. In the presence of a bending movement the measuring conductor 6 is necessarily also subjected to a correspondingly mechanical stress. A damaged location, or even a fracture location, then arises in the presence of wear to the measuring conductor 6, effectively leading to a shortened measuring conductor 6, so that here again the initial overlay becomes lost, as a result of which the measuring unit 14 recognizes the wear.

In order to make sure that the measuring conductor 6 fractures before the conductor 10 of the core 8, the measuring conductor 6 is arranged further outward in the radial direction R than the core 8 with respect to a neutral fiber 28 of the line 4. As a result, the measuring conductor 6 is subjected to a heavier mechanical stress, and wears correspondingly faster.

The determination of whether an overlay is or is not present is in itself sufficient to realize monitoring of the line 4. In one variant, however, a quantitative monitoring is carried out in addition to or instead of such a merely qualitative monitoring, which also permits a determination of an operating parameter, e.g. the temperature of the line 4. For this purpose, the clock rate is adjusted by means of the measuring unit 14, and is changed until an overlay is present. The clock rate is thus modified in the presence of a change to the transit time, in order to establish an overlay again, i.e. the measuring pulses and the reflected portions are synchronized. The modified clock rate is then a measure of the magnitude of the change of the state of the line 4. A quantitative temperature measurement is, for example, realized through regular or continuous adjustment of the clock rate. The clock rate is adjusted, for example, in that the pauses 20 are extended or shortened, i.e. in that 0-bits are added or removed.

The invention claimed is:

1. A method for monitoring a line having a predetermined length and a measuring conductor, which comprises the steps of:
    feeding a plurality of measuring pulses into the measuring conductor, and in a normal state of the line, the measuring pulses have a transit time which is known in advance due to the predetermined length of the line, and respective reflected portions of the measuring pulses are generated which propagate in an opposite direction to the measuring pulses;
    monitoring the line and a determination is made as to whether an overlay of the measuring pulses with the respective reflected portions is present at a predetermined measuring point, wherein the measuring pulses and the respective reflected portions being overlaid at the predetermined measuring point in the normal state of the line; and
    recognizing, in dependence on the overlay, a deviation of the transit time from a previously known transit time, and a deviation from the normal state.

2. The method according to claim 1, which further comprises measuring the overlay by checking whether an overvoltage with respect to a transmitted voltage of the measuring pulses is present at the predetermined measuring point.

3. The method according to claim 1, wherein the measuring pulses are composed of a digital measuring signal.

4. The method according to claim 1, which further comprises repeatedly generating the measuring pulses with a settable clock rate which is adjusted until the measuring pulses and the respective reflected portions are overlaid at an adjusted clock rate.

5. The method according to claim 4, which further comprises determining an operating parameter of the line on a basis of the adjusted clock rate.

6. The method according to claim 5, which further comprises disposing a material along the measuring conductor and having a dielectric coefficient that depends on the operating parameter of the line.

7. The method according to claim 1, wherein the measuring conductor is connected to a measuring terminal of a measuring unit, by means of which the measuring pulses are generated and by means of which the overlay is measured.

8. The method according to claim 5, wherein the operating parameter of the line is temperature.

9. A measuring configuration, comprising:
    a line having a predetermined length and a measuring conductor;
    a measuring unit configured for monitoring said line, said measuring unit configured to:
        feed a plurality of measuring pulses into said measuring conductor, wherein in a normal state of said line, the measuring pulses have a transit time which is known in advance due to the predetermined length of said line, and wherein respective reflected portions of the measuring pulses are generated which propagate in an opposite direction to the measuring pulses; and
        monitor said line and a determination is made as to whether an overlay of the measuring pulses with the respective reflected portions is present at a predetermined measuring point, wherein the measuring pulses and the respective reflected portions being overlaid at the predetermined measuring point in the normal state of the line, and depending on the overlay, a deviation of the transit time from a previously known transit time, and a deviation from the normal state, are recognized.

10. The measuring configuration according to claim 9, wherein said measuring unit is configured such that the measuring pulses are generated with a clock rate, and the clock rate is set depending on the previously known transit time in the normal state and depending on the predetermined length of said line.

11. The measuring configuration according to claim 9, wherein said line has at least one core as well as a neutral fiber, which does not undergo a change in length in a presence of bending stress, and with respect to which said measuring conductor is disposed further outward in a radial direction than the core.

12. A measuring method, which comprises the steps of:
    providing a line having a measuring conductor and a measuring unit in an on-board network, said measuring unit programmed to:
        feed a plurality of measuring pulses into the measuring conductor, and in a normal state of the line, the measuring pulses have a transit time which is known in advance due to the predetermined length of the line, and respective reflected portions of the measuring pulses are generated which propagate in an opposite direction to the measuring pulses;
        monitor the line and a determination is made as to whether an overlay of the measuring pulses with the respective reflected portions is present at a predetermined measuring point, wherein the measuring pulses and the respective reflected portions being overlaid at the predetermined measuring point in the normal state of the line; and recognize, in dependence on the overlay, a deviation of the transit time from a previously known transit time, and a deviation from the normal state.

\* \* \* \* \*